US012237258B2

(12) United States Patent
Nikoukary et al.

(10) Patent No.: US 12,237,258 B2
(45) Date of Patent: Feb. 25, 2025

(54) CROSSTALK CANCELATION STRUCTURES HAVING METAL LAYERS BETWEEN SIGNAL LINES SEMICONDUCTOR PACKAGES

(71) Applicant: Rambus Inc., San Jose, CA (US)

(72) Inventors: Shahram Nikoukary, Mountain View, CA (US); Dongwoo Hong, Irvine, CA (US); Jonghyun Cho, Saratoga, CA (US)

(73) Assignee: Rambus Inc., San Jose, CA (US)

( * ) Notice: Subject to any disclaimer, the term of this patent is extended or adjusted under 35 U.S.C. 154(b) by 622 days.

(21) Appl. No.: 17/608,725

(22) PCT Filed: Apr. 30, 2020

(86) PCT No.: PCT/US2020/030859
§ 371 (c)(1),
(2) Date: Nov. 3, 2021

(87) PCT Pub. No.: WO2020/227033
PCT Pub. Date: Nov. 12, 2020

(65) Prior Publication Data
US 2022/0319980 A1    Oct. 6, 2022

Related U.S. Application Data

(60) Provisional application No. 62/844,709, filed on May 7, 2019.

(51) Int. Cl.
*H01L 23/522*    (2006.01)
*H01L 23/498*    (2006.01)
(Continued)

(52) U.S. Cl.
CPC .... *H01L 23/5225* (2013.01); *H01L 23/49816* (2013.01); *H01L 23/49822* (2013.01);
(Continued)

(58) Field of Classification Search
CPC ........... H01L 23/5225; H01L 23/49816; H01L 23/49822; H01L 23/49838; H01L 23/5223;
(Continued)

(56) References Cited

U.S. PATENT DOCUMENTS 6,091,144 A    7/2000    Harada
6,384,485 B1    5/2002    Matsushima
(Continued)

OTHER PUBLICATIONS

Notification of Transmittal of the International Search Report and the Written Opinion of the International Searching Authority, or the Declaration with Mail Date Aug. 4, 2020 re: Int'l Appln. No. PCT/US2020/030859. 14 pages.

*Primary Examiner* — Michael Jung
(74) *Attorney, Agent, or Firm* — Lowenstein Sandler LLP

(57) ABSTRACT

The embodiments herein are directed to technologies for crosstalk cancellation structures. One semiconductor package includes conductive metal layers separated by insulating layers, the conductive metal layers for routing signals between external package terminals and pads on an integrated circuit device. Signal lines formed in the conductive metal layers have electrode structure (capacitor electrode-like structures) formed for at least adjacent signaling lines of the package terminals. Two of the electrode structures from the adjacent signaling lines are formed opposite each other on different metal layers.

12 Claims, 6 Drawing Sheets

(51) Int. Cl.
  *H01L 23/528* (2006.01)
  *H03K 19/003* (2006.01)
  *H04B 15/02* (2006.01)
  *H01L 23/66* (2006.01)
(52) U.S. Cl.
  CPC .... *H01L 23/49838* (2013.01); *H01L 23/5223* (2013.01); *H01L 23/5226* (2013.01); *H01L 23/5283* (2013.01); *H03K 19/00346* (2013.01); *H04B 15/02* (2013.01); *H01L 23/66* (2013.01); *H01L 2223/6622* (2013.01); *H01L 2223/6672* (2013.01)
(58) Field of Classification Search
  CPC ............ H01L 23/5226; H01L 23/5283; H03K 19/00346; H04B 15/02
  See application file for complete search history.

(56) References Cited

U.S. PATENT DOCUMENTS

| | | | |
|---|---|---|---|
| 6,395,996 B1* | 5/2002 | Tsai | H01L 23/49827 361/761 |
| 7,002,248 B2 | 2/2006 | Akram et al. | |
| 7,167,019 B2 | 1/2007 | Broyde et al. | |
| 7,230,317 B2 | 6/2007 | Pearson et al. | |
| 7,355,234 B2 | 4/2008 | Hoshino | |
| 7,523,246 B2 | 4/2009 | Liaw et al. | |
| 7,615,869 B2 | 11/2009 | Koo et al. | |
| 7,714,590 B2 | 5/2010 | Jow et al. | |
| 8,653,626 B2 | 2/2014 | Lo et al. | |
| 9,585,242 B2 | 2/2017 | Coutts et al. | |
| 9,722,012 B1 | 8/2017 | Pathmanathan et al. | |
| 10,157,657 B2 | 12/2018 | Zheng et al. | |
| 10,181,410 B2 | 1/2019 | Song et al. | |
| 2002/0076919 A1 | 6/2002 | Peters et al. | |
| 2003/0049885 A1* | 3/2003 | Iijima | H01L 21/4857 438/106 |
| 2005/0258532 A1* | 11/2005 | Yoshikawa | H05K 1/0237 257/784 |
| 2010/0327989 A1* | 12/2010 | Abbott | H03H 7/38 716/100 |
| 2011/0316119 A1 | 12/2011 | Kim et al. | |
| 2012/0098090 A1 | 4/2012 | Hebert et al. | |
| 2013/0258623 A1 | 10/2013 | Zeng | |
| 2014/0104802 A1* | 4/2014 | Oikawa | H01L 23/49822 361/783 |
| 2015/0294791 A1 | 10/2015 | Hwang et al. | |
| 2015/0348901 A1* | 12/2015 | Warwick | H05K 1/116 257/774 |
| 2016/0141257 A1 | 5/2016 | Sundaram et al. | |
| 2016/0218083 A1* | 7/2016 | Kariyazaki | H01L 23/147 |
| 2017/0213776 A1 | 7/2017 | Oikawa et al. | |
| 2018/0286797 A1* | 10/2018 | Goh | H01L 21/486 |
| 2019/0341342 A1* | 11/2019 | Raorane | H01L 21/4857 |

\* cited by examiner

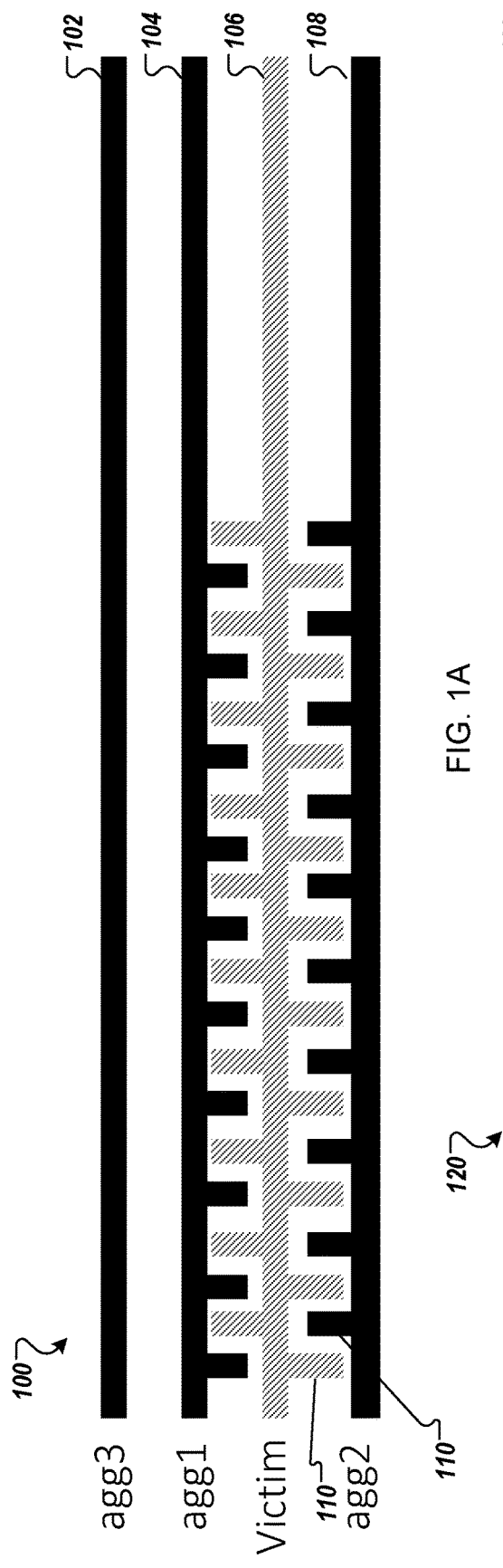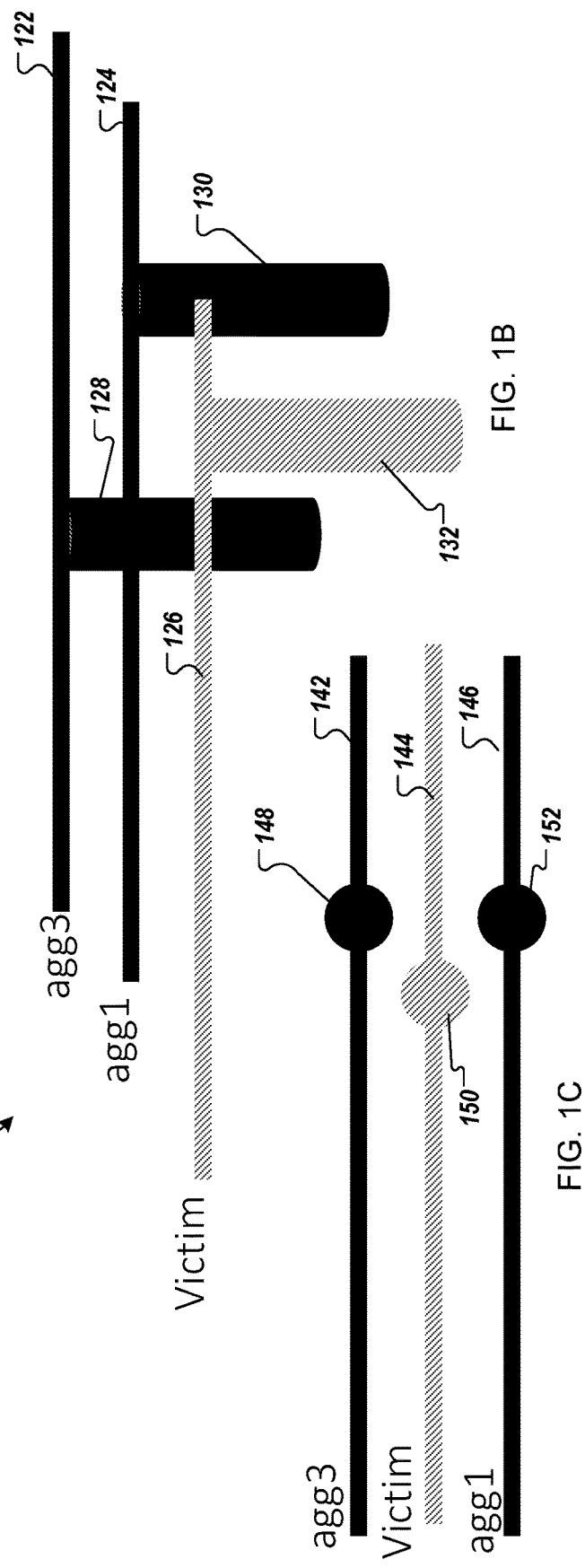

CROSSTALK CANCELATION STRUCTURES HAVING METAL LAYERS BETWEEN SIGNAL LINES SEMICONDUCTOR PACKAGES

BACKGROUND

In high-speed electronics, two adjacent signal lines such as those used in single-ended buses of memory interfaces can suffer from crosstalk. Crosstalk can occur as a result of a signal being transmitted on a first signal line in a channel (a single-ended signal line or a differential pair of lines) that creates an undesired effect on a second signal line in the channel. The first signal line can be considered an adjacent aggressor (or just "aggressor") and the second signal line can be considered a victim. Crosstalk is a form of channel loss since the undesired effect induced by an aggressor can cause channel loss on the victim. Crosstalk (XTalk) is viewed in two forms depending on the location which is measured as Near End XTalk (NEXT) or Far End Xtalk. Crosstalk coupling has two mechanisms, inductive and capacitive coupling; these two mechanisms work in opposite polarity. Capacitive coupling induces a positive noise and inductive coupling induces a negative noise. FEXT is usually dominant in microstrip structures and has additional inductive coupling, for example. In the present disclosure, structures are constructed which intentionally add capacitive coupling to cancel and offset the inductive coupling. Furthermore, in multi-layer integrated circuit (IC) (also referred to as "chip"), multi-layer packages, and multi-layer printed circuit boards (PCBs), there are one or more conductive pads (terminals), one or more networks (or nets), and a referencing plane. A net can include a collection of signal lines in a conductive metal layer of the IC and the IC can include multiple nets in different conductive metal layers. The multiple conductive metal layers are separated by insulating layers. Whenever a large pad is used to connect to a net, additional capacitance between the conductive pad and the referencing plane may cause additional channel loss due to an impedance mismatch and capacitive loading. For example, the large pad size for structures, such as a ball grid array (BGA) structure with multiple BGA pads, is highly capacitive which causes additional reflection and loading on the signals.

BRIEF DESCRIPTION OF THE DRAWINGS

The present disclosure is illustrated by way of example, and not by way of limitation, in the figures of the accompanying drawings.

FIG. 1A is a top view illustrating four signal lines of a channel in which there are three aggressors that cause crosstalk on a victim according to one implementation.

FIG. 1B is a side view illustrating three signal lines and three vias of a channel in which there are two aggressors that cause crosstalk on a victim according to one implementation.

FIG. 1C is a top view illustrating three signal lines and three vias of a channel according to another implementation.

DETAILED DESCRIPTION

Figure 2:
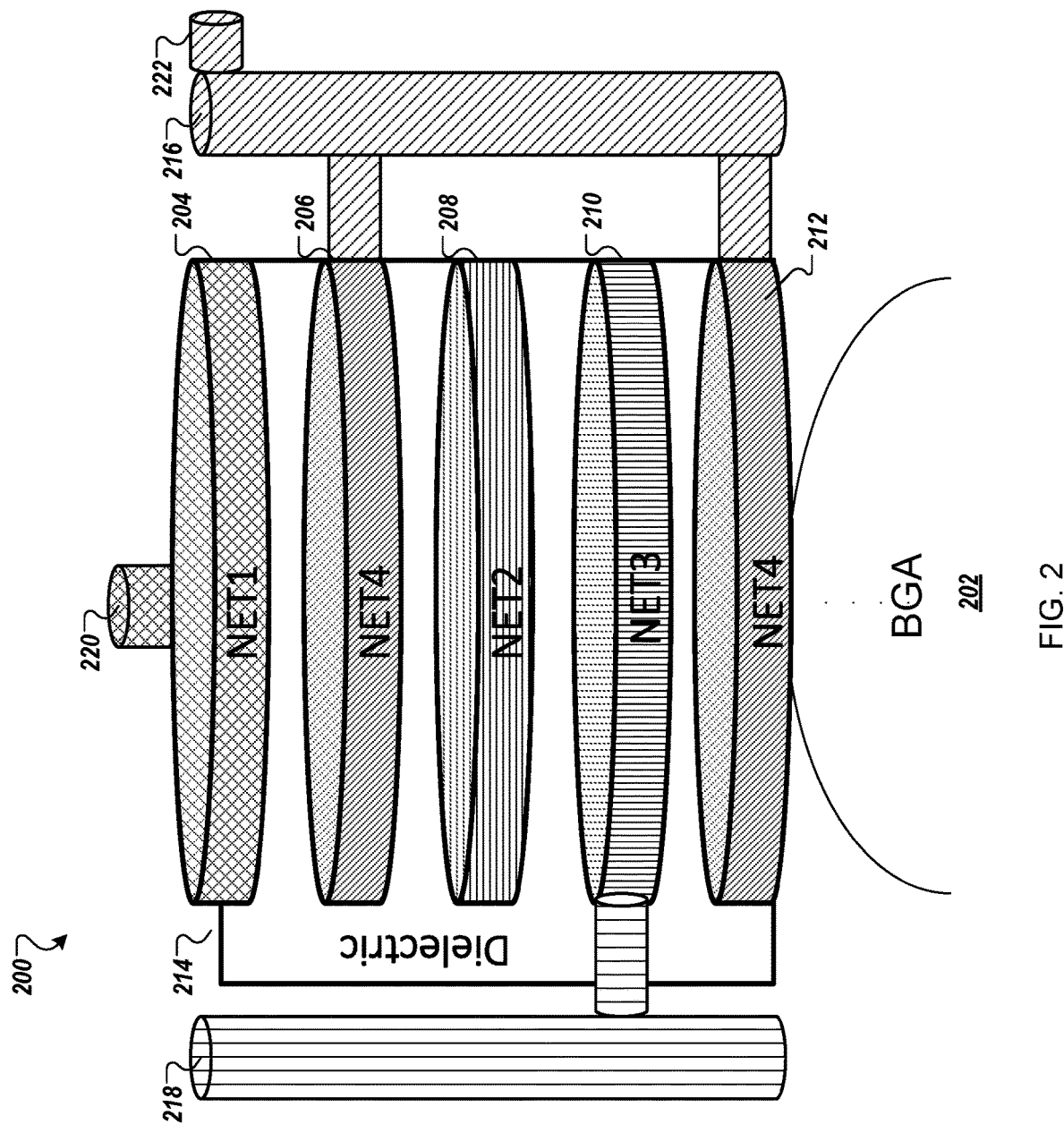
FIG. 2 is a side view of multiple crosstalk cancelation structures in multiple nets of a multi-layer package where the crosstalk cancelation structures are disposed opposite one another in the different layers and aligned with a BGA pad according to one embodiment.

Many electronic devices (e.g., cell phones, tablets, set-top boxes, etc.) use integrated circuits that have an integrated circuit die in a semiconductor package. As described above, adjacent signal lines in a channel can suffer from crosstalk, causing eye closure in channel simulation and margin loss. The crosstalk can be caused by capacitance and inductance coupling between a victim net and the nearby aggressors. In the present disclosure, structures are constructed which intentionally add capacitive coupling to cancel and offset the inductive coupling. In the present disclosure, capacitance is formed between different nets using these pads which can offset the inductive coupling between them. Furthermore, implementing this novel structure, the capacitance between the signal and power/ground net is also reduced which further improves the performance.

Aspects of the present disclosure address the above and other deficiencies by coupling crosstalk cancelation structures to adjacent signal lines in the different conductive metal layers that are separated by insulating layers. The capacitance of the crosstalk cancelation structures is used to reduce the inductively induced crosstalk from adjacent aggressors in the channel to lower the total XTalk. Aspects of the present disclosure allow a designer of the signal lines of the multi-layer IC, the multi-layer packages, and multi-layer PCBs, to use this capacitance to reduce the crosstalk from adjacent aggressors in the channel. By using a multi-layer stack-up structure with the electrode structures opposite one another in two or more different layers, crosstalk from several neighboring aggressors are reduced. Aspects of the present disclosure are applicable (but not limited) to ICs, packages, PCBs and any multi-layer device with at least two conductive metal layers and a dielectric layer in between the at least two conductive metal layers.

In one embodiment, a semiconductor package includes conductive metal layers separated by insulating layers, the conductive metal layers for routing signals between external package terminals and pads on an integrated circuit device. Signal lines formed in the conductive metal layers have electrode structure (capacitor electrode-like structures) formed for at least adjacent signaling lines of the package terminals. Two of the electrode structures from the adjacent signaling lines are formed opposite each other on different metal layers.

In one embodiment, a package includes an integrated circuit die with multiple conductive pads (or other types of terminals) that connect to multiple package terminals through signal lines. The signal lines can be disposed on multiple conductive metal layers separated by insulating layers. The signal lines formed in the conductive metal layers route signals between the package terminals and the conductive pads. The signal lines can be wires, conductive traces, vias (also referred to as via transitions), or any combination of conductors that create an electrical path between a package terminal and a pad or terminal of the integrated circuit die. During package assembly, the interconnect terminal of the IC die is coupled to the interconnect terminal of the package. The integrated circuit die typically includes active and passive circuitry only on one side. For example, an integrated circuit die can include passive and active circuitry (e.g., transistors, diodes, resistors, capacitors, etc.). The semiconductor package can include package terminals, such as BGA pads (also referred to as BGA pins). During packaging, the package terminals are coupled to the terminals (e.g., conductive pads) of the integrated circuit die via a multi-level structure having multiple conductive metal layers with signal lines and crosstalk cancelation structures as described herein. The interconnect terminal types may be other types of interconnects than BGA pads, such as copper pillars, fan-out wafer-level packaging, chip-scale packaging (e.g., Wafer Level Chip Scale Packaging (WLCSP)), Package-on-Package (PoP), wafer bumping, controlled collapse chip connection (C4) solder bumps, conductive pads, or the like.

In the embodiment disclosed herein, an increase in signaling performance may be realized by providing enough mutual capacitance between the victim and the aggressors to fully cancel mutual inductance to achieve near zero FEXT, by addressing FEXT from multiple aggressors, and addressing the self-capacitance (reference to ground). Reducing the crosstalk in a channel and reducing loading capacitance in the channel can enable higher data rates and improve margins.

FIG. 1A is a top view illustrating four signal lines of a channel 100 in which there are three aggressors that cause crosstalk on a victim according to one implementation. The channel 100 includes a first signal line 102, a second signal line 104, a third signal line 106, and a fourth signal line 108. During operation, a signal can be transmitted on the second signal line 104. Due to the second signal line 104 and third signal line 106 being adjacent signal lines, the second signal line 104 can be an aggressor that causes crosstalk on the third signal line 106 as a victim. Similarly, a signal can be transmitted on the fourth signal line 108. Due to the fourth signal line 108 and third signal line 106 being adjacent signal lines, the fourth signal line 108 can be a second aggressor that causes crosstalk on the third signal line 106. Even the proximity of the first signal line 102 can cause the first signal line 102 to be a third aggressor when a signal is transmitted on the first signal line 102. In some cases, additional stubbed segments 110 can be added to the signal lines to help reduce crosstalk between an aggressor and a victim. However, as illustrated in FIG. 1A, the additional stubbed segments 110 do not reduce crosstalk between the first signal line 102 as the third aggressor to victim.

FIG. 1B is a side view illustrating three signal lines and three vias of a channel 120 in which there are two aggressors that cause crosstalk on a victim according to one implementation. The channel 120 includes a first signal line 122, a second signal line 124, and a third signal line 126, as well as corresponding vias 128, 130, and 132 individually coupled to the first signal line 122, the second signal line 124, and the third signal line 126, respectively. During operation, signals can be transmitted on the first and second signal lines 122, 124 that cause crosstalk on the third signal line 126 as a victim to the two aggressors.

FIG. 1C is a top view illustrating three signal lines and three vias of a channel 140 according to another implementation. The channel 140 includes a first signal line 142, a second signal line 144, and a third signal line 146, as well as corresponding vias 148, 150, and 152 individually coupled to the first signal line 142, the second signal line 144, and the third signal line 146, respectively. During operation, signals can be transmitted on the first and third signal lines 142, 146 that cause crosstalk on the second signal line 144 as a victim to the two aggressors.

FIG. 2 is a side view of multiple crosstalk cancelation structures in multiple nets of a multi-layer package 200 where the crosstalk cancelation structures are disposed opposite one another in the different layers and aligned with a BGA pad 202 according to one embodiment. The multi-layer package 200 includes multiple BGA pads, including the BGA pad 202 illustrated in FIG. 2. The multi-layer package 200 also includes multiple conductive metal layers separated by a dielectric 214. The dielectric 214 can be one or more insulating layers that separate the multiple conductive metal layers. A signal line in one of the conductive metal layers can be coupled to a signal line in another one of the conductive metal layers using a via, such as the vias 216, 218, and 220 illustrated in FIG. 2.

As described above, a capacitance caused by the BGA pad 202 and/or adjacent signal lines in any of the multiple conductive metal layers can be reduced by crosstalk cancelation structures, such as the crosstalk cancelation structures (electrode structures 204, 206, 208, 210, and 212 illustrated in FIG. 2), which coupled to signal lines of the multi-layer package. The electrode structures 204, 206, 208, 210, and 212 can be similar to electrodes of a capacitor (or capacitor-electrode like structures). The electrode structures can be circular structures that effectively correspond to the BGA pad 202. In some cases, a width (or diameter) of the electrode structures 204, 206, 208, 210, and 212 can correspond to a width (or diameter) of the BGA pad 202. In other embodiments, different shapes and sizes of the electrode structures can be used.

The electrode structures 204, 206, 208, 210, and 212 can improve channel performance by reducing the crosstalk caused by excessive mutual inductance at the same time reduce capacitive loading caused by the BGA pad 202.

By increasing the mutual capacitance between any two of the electrode structures 204, 206, 208, 210, and 212 (e.g., crosstalk cancelation structures), the mutual capacitances reduces crosstalk caused by excessive mutual inductance while reducing the capacitive loading caused by the BGA pad 202. By reducing the crosstalk, the electrode structures 204, 206, 208, 210, and 212 can also enable higher data rates, as compared to channels that do not use the crosstalk cancelation structures. The electrode structures 204, 206, 208, 210, and 212 (crosstalk cancelation structures) can also improve the margin by reducing crosstalk.

In one embodiment, the multi-layer package 200 is a semiconductor package that includes an integrated circuit device (also referred to as integrated circuit die), package terminals such as the BGA pad 202, and multiple conductive metal layers separated by insulating layers. The integrated circuit device includes conductive pads or other types of terminals. The conductive metal layers can include signal lines formed in the conductive metal layers (net1, net2, net3, net 4) to route signals between the package terminals and the conductive pads of the integrated circuit device.

In one embodiment, the multi-layer package 200 includes a first signal line 222 in a first conductive metal layer (net1) and a second signal line (not illustrated in FIG. 2) in the first conductive metal layer (net1), where the first signal line and the second signal line are adjacent signal lines. A first electrode structure 206 is disposed in a second conductive metal layer and a first insulating layer is disposed between the first conductive metal layer (net1) and the second conductive metal layer (net4). A first via 216 is coupled to the first signal line 222 in the first conductive metal layer and the first electrode structure 206 disposed in the second conductive metal layer (net4). A second electrode structure 204 is disposed in the first conductive metal layer and coupled to the second signal line (not illustrated in FIG. 2). In this embodiment, the first electrode structure 206 and the second electrode structure 204 are disposed opposite each other on the respective layers.

In another embodiment, a first signal line is coupled to a first package terminal, such as the BGA pad 202 of FIG. 2. A second signal line can be to a second package terminal. The first signal line and second signal line can be adjacent signal lines. The first line can include a first electrode structure disposed in a first layer and the second line can include a second electrode structure disposed in a second layer. The first electrode structure and the second electrode structure are formed opposite each other on the first layer and the second layer, respectively. It should be noted that FIG. 2 illustrates 4 electrode structures in a stack above the BGA pad 202. In other embodiments, the stack above the BGA pad 202 can be two or more electrode structures. Each of the electrode structures 204-212 can be coupled to a via between two or more of the layers of the multi-layer package 200. For example, via 218 is coupled to the electrode structure 210, the via 220 is coupled to the electrode structure 204, and the via 216 is coupled to the electrode structure 206. The vias can also be connected to more than one electrode structures, including multiple electrode structures in a same stake, such as illustrated with the via 216 being coupled to the electrode structure 206 and the electrode structure 212.

In a further embodiment, the multi-layer package 200 includes a third signal line coupled to a third package terminal, the third signal line being adjacent to at least one of the first signal line or the second signal line. The third signal line can include a third electrode structure disposed in a third layer. As noted above, the first signal line can include a fourth electrode structure disposed in a fourth layer, such as illustrated with the electrode structures 206, 212. For example, the via 216 can couple the fourth electrode structure 212 in the fourth layer and the first electrode structure 206 in the second layer (net4).

In one embodiment, a first via is coupled to a first package terminal and a first electrode structure and a second via is coupled to a second package terminal and a second electrode structure, where the first and second electrode structures are disposed opposite one another in the respective layers of the multi-layer package 200. In a further embodiment, the multi-layer package 200 can further includes a third package terminal, a third via coupled to the third package terminal, and a third signal line coupled to the third package terminal. The third signal line can include a third electrode disposed in a third layer. The second electrode structure and the third electrode structure are formed opposite each other on the respective layers. In a further embodiment, the multi-layer package 200 further includes a fourth package terminal, a fourth via coupled to the fourth package terminal, and a fourth signal line coupled to the fourth package terminal. The fourth signal line can include a fourth electrode disposed in a fourth layer. The third electrode structure and the fourth electrode structure are formed opposite each other on the respective layers.

Figure 3:
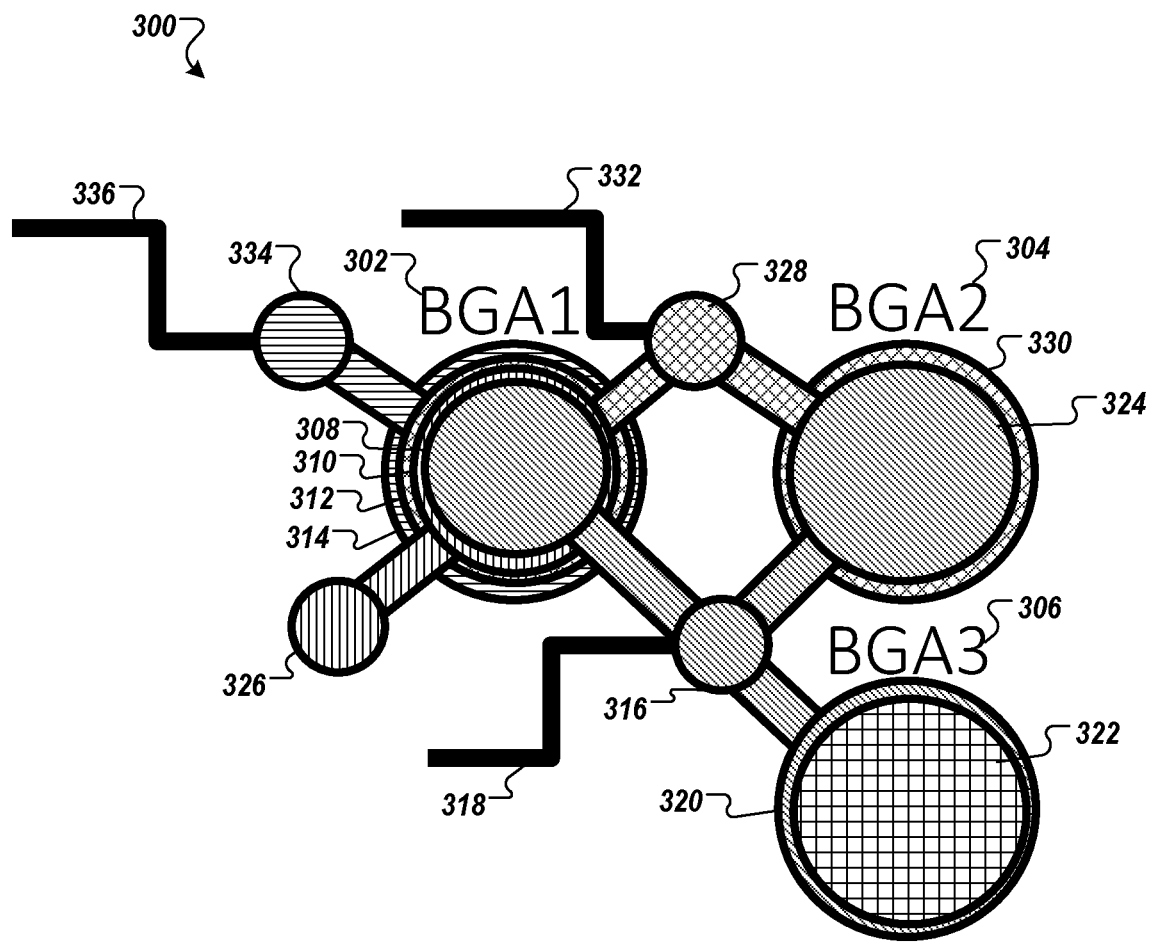
FIG. 3 is a top view of multiple crosstalk cancelation structures disposed opposite one another in different layers of a multi-layer package and aligned with respective BGA pads according to one embodiment.

FIG. 3 is a top view of multiple crosstalk cancelation structures disposed opposite one another in different layers of a multi-layer package 300 and aligned with respective BGA pads according to one embodiment. In FIG. 3, the multi-layer package 300 includes a first BGA pad 302, a second BGA pad 304, and a third BGA pad 306. On a top side of the first BGA pad 302 (or a bottom side if the oriented with the BGA pads on top), there is a stack-up of four crosstalk cancelation structures 308, 310, 312, and 314. Although not illustrated as a ball in FIG. 3, the first BGA pad 302 is aligned with four crosstalk cancelation structures 308, 310, 312, and 314. The first crosstalk cancelation structure 308 is disposed opposite to the first BGA pad 302 in a layer above or in a same layer. This can be considered the first layer or first net. The first BGA pad 302 can be physically in contact with the first crosstalk cancelation structure 308. The second crosstalk cancelation structure 310 is disposed opposite to the first crosstalk cancelation structure 308 in two different layers. That, is the second crosstalk cancelation structure 310 is disposed in a second layer. The third crosstalk cancelation structure 312 is disposed opposite to the second crosstalk cancelation structure 310 in two different layers. That is, the third crosstalk cancelation structure 312 is disposed in a third layer. The fourth crosstalk cancelation structure 314 is disposed opposite to the third crosstalk cancelation structure 312 in two different layers. That is, the fourth crosstalk cancelation structure 314 is disposed in a fourth layer. The fourth layer can be a top layer of the multi-layer package 300. Between each of the layers, there may be insulating layers that insulate the crosstalk cancelation structures from each other, forming capacitor plates of a capacitor. The first crosstalk cancelation structure 308 is coupled to a first via 316. The first via 316 connects to a first signal line 318 in a top layer of the multi-layer package 300. As noted above, the top layer can be the fourth layer in which the fourth crosstalk cancelation structure 314 is disposed. The first via 316 also connects to a fifth crosstalk cancelation structure 320. The fifth crosstalk cancelation structure 320 can be aligned with the third BGA pad 306. The fifth crosstalk cancelation structure 320 can be disposed in any of the layers above a sixth crosstalk cancelation structure 322. The sixth crosstalk cancelation structure 322 is disposed above and aligned with the third BGA pad 306 in one of the layers and the fifth crosstalk cancelation structure 320 is disposed above the sixth crosstalk cancelation structure 322. The sixth crosstalk cancelation structure 322 can be coupled to a via (not illustrated in FIG. 3) and a corresponding signal line. The first via 316 also connects to a seventh crosstalk cancelation structure 324 disposed in a layer above the second BGA pad 304. The seventh crosstalk cancelation structure 324 can be disposed in any one of the layers. The seventh crosstalk cancelation structure 324 is aligned with the second BGA pad 304.

The second crosstalk cancelation structure 310 is coupled to a second via 326. Although not illustrated in FIG. 3, a signal line can be connected to the second via 326. The third crosstalk cancelation structure 312 is coupled to a third via 328. The third via 328 can also be connected to an eighth crosstalk cancelation structure 330. The eighth crosstalk cancelation structure 330 can be disposed in any one of the layers above the seventh crosstalk cancelation structure 324 that is aligned with the second BGA pad 304. The third via 328 connects to a second signal line 332 in the top layer. As noted above, the top layer can be the fourth layer in which the fourth crosstalk cancelation structure 314 is disposed.

The fourth crosstalk cancelation structure 314 is coupled to a fourth via 334. The fourth via 334 connects to a third signal line 336 in the top layer. As noted above, the top layer can be the fourth layer in which the fourth crosstalk cancelation structure 314 is disposed.

As described above, in high-speed electronics, signaling over buses used in memory interfaces may suffer from crosstalk induced by adjacent aggressors. Furthermore, in multi-layer IC, packages and multi-layer PCBs, whenever a large pad (e.g., BGA pad) is connected to a net, the additional capacitance between the pad's plate and the referencing plane may cause additional loss due to impedance mismatch and the capacitive loading. Using the multi-layer package 300, the referencing of the BGA pad is changed to the neighboring net and this capacitance will be utilized to create additional mutual capacitive coupling between the two (or more) nets to cancel some of the inductive crosstalk between the two or more aggressors. The multi-layer package 300 can be used to reduce crosstalk by the mutual capacitance created between the two aggressors which will cancel out the excessive inductively induced crosstalk (FEXT). The capacitive crosstalk and inductive crosstalk are opposite in polarity, therefore by inducing additional capacitive crosstalk, the inductive crosstalk is reduced.

Figure 4:
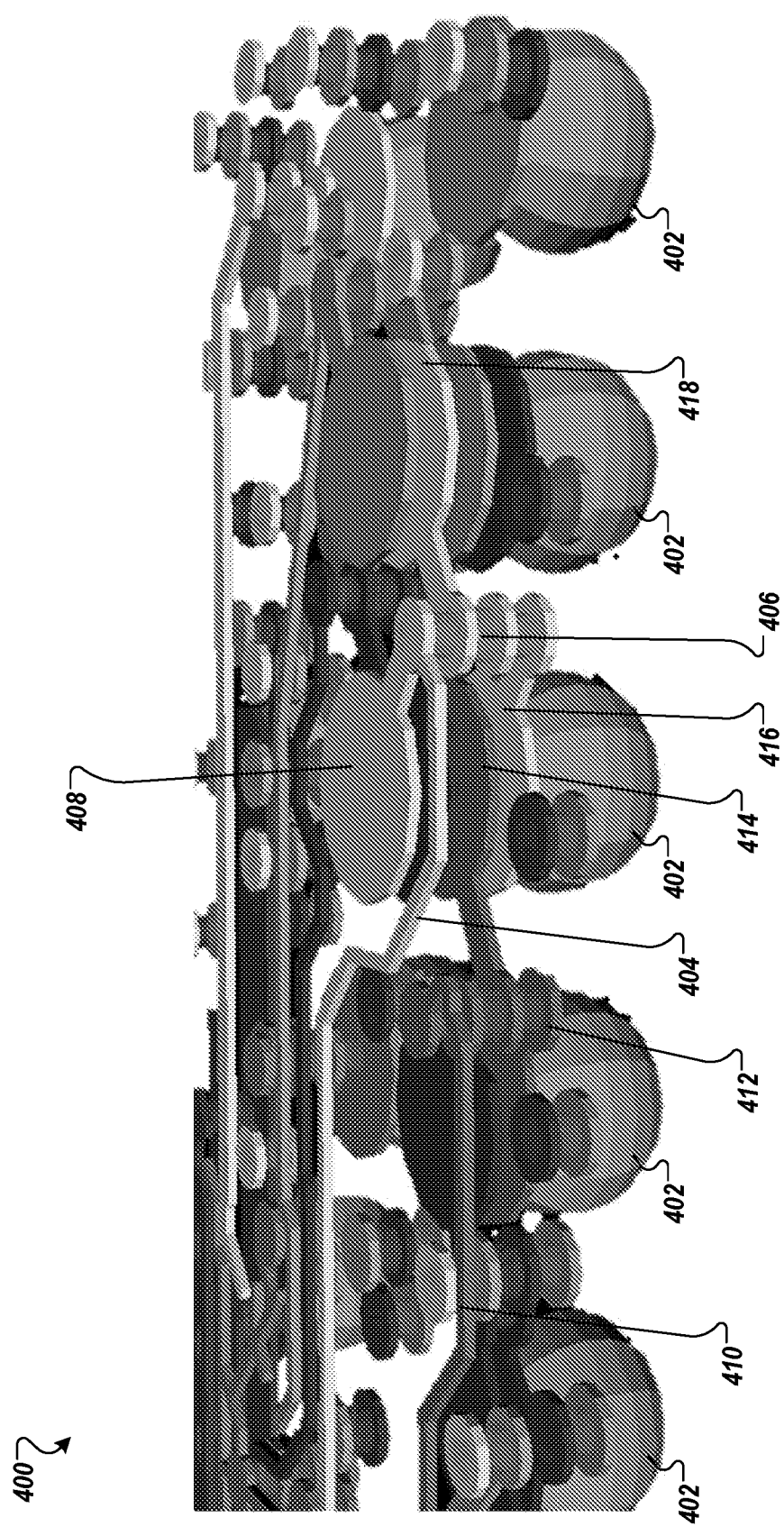
FIG. 4 is a perspective view of a multi-layer package having multiple BGA pads with crosstalk cancelation structures disposed in the different layers of the package to reduce crosstalk between adjacent signal lines of the package according to one embodiment.

FIG. 4 is a perspective view of a multi-layer package 400 having multiple BGA pads with crosstalk cancelation structures disposed in the different layers of the package to reduce crosstalk between adjacent signal lines of the package according to one embodiment. The multi-layer package 400 includes multiple BGA pads 402. Above each of the BGA pads 402, there are different combinations of crosstalk cancelation structures, each crosstalk cancelation structure corresponding to one of the signal lines. For example, a first signal line 404 on a top layer (layer 4 or L4) is routed to a first via 406. The first via 406 is coupled to a first crosstalk cancelation structure 408. The first crosstalk cancelation structure 408 is a disk shape that has a similar diameter to a diameter of the underlying BGA pad 402. A second signal line 410 on the top layer is routed to a second via 412. The second via 412 is coupled to a second crosstalk cancelation structure 414 that is disposed in a second layer (layer 2 or L2) that is below the top layer. The first signal line 404 and the second signal line 410 are adjacent signal lines on the top layer (L4). The first crosstalk cancelation structure 408 and the second crosstalk cancelation structure 414 are disposed opposite one another in the top layer (L4) and the second layer (L2), respectively. The second crosstalk cancelation structure 414 is a disk shape that has a similar diameter to a diameter of the underlying BGA pad 402.

In a further embodiment, as illustrated in FIG. 4, the first via 406 is also coupled to a third crosstalk cancelation structure 416 that is disposed in a first layer (layer 1 or L1) that is below the second layer (L2). An example of an integrated crosstalk reduction structure above a BGA pad shown here. Each color represents a different net. Different combination of mutual capacitances between different nearby aggressors could be constructed by swapping the plates.

In a further embodiment, as illustrated in FIG. 4, the first via 406 is also coupled to a fourth crosstalk cancelation structure 418 that is disposed in a third layer (layer 3 or L3). The fourth crosstalk cancelation structure 418 is disposed above an adjacent BGA pad 402. The adjacent BGA pad 402 has a different combination of crosstalk cancelation structures than the combination of the crosstalk cancelation structures 408, 414, and 416.

Using the first via 406 next to the BGA pad 402, the multi-layer package 400 creates an overlapping electrode structure or PADs above the respective BGA pad 402 to reduce crosstalk between the first signal line 404 and the second signal line 410. The overlapping electrode structure or PADs above the respective BGA pad 402 can also reduce crosstalk between the first signal line 404 and another one or more adjacent signal lines and can reduce the crosstalk between the second signal line 410 and another one or more adjacent signal lines. The different combinations of overlapping electrode structures or PADs above the multiple BGA pads 402 of the multi-layer package 300 can be used to address several aggressors.

In the depicted embodiment, the crosstalk cancelation structures have diameters as the diameters of the BGA pads 402. In other embodiments, the diameters of the crosstalk cancelation structures can be adjusted to control a desired mutual capacitance between any two signal lines. As expressed in the equation (1), the mutual capacitance can be adjusted by adjusting an area A of the plates, plate spacing (thickness of dielectric between plates), and a dielectric constant.

$$C = \varepsilon A \frac{\varepsilon A}{d} \qquad (1)$$

Where C is capacitance, d is the plate spacing (or thickness of the dielectric between the plates), and c is the dielectric constant. Based on the crosstalk between signal lines, the mutual capacitance can be controlled using the size of the electrode structure as described above, as well as by the number of overlapping electrode structure between the signal lines, such as illustrated and described below with respect to FIG. 5.

Figure 5:
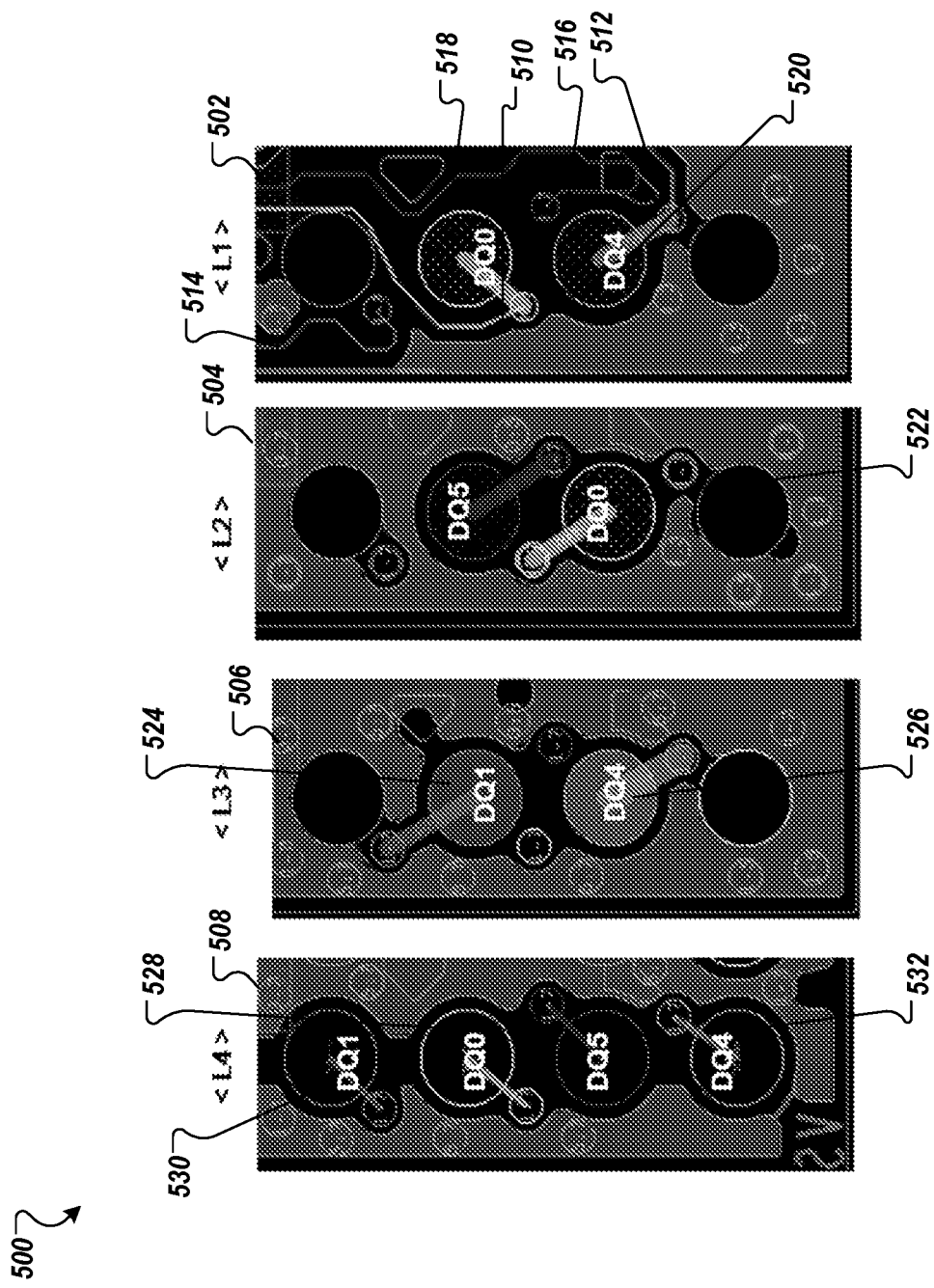
FIG. 5 is a top view of individual layers of a multi-layer package having crosstalk cancelation structures to reduce crosstalk between adjacent signals lines of the multi-layer package according to one embodiment.

FIG. 5 is a top view of individual layers of a multi-layer package 500 having crosstalk cancelation structures to reduce crosstalk between adjacent signals lines of the multi-layer package according to one embodiment. The multi-layer package 500 includes a first layer 502 (L1), a second layer 504 (L2), a third layer 506 (L3), and a fourth layer 508 (L4). The multi-layer package 500 can be used to connect terminals of an integrated circuit within the package and package terminals of the package. In the first layer 502 (L1), there are four data lines 510, 512, 514, and 516. The four data lines 510 can be considered four adjacent signal lines that are susceptible to crosstalk. The multi-layer package 500 includes multiple crosstalk cancelation structures in multiple layers. In the first layer 502 (L1), there are a first crosstalk cancelation structure 518 (labeled DQ0) and a second crosstalk cancelation structure 520 (labeled DQ4). The first crosstalk cancelation structure 518 is coupled to the first signal line 510 and a first via that connects to the other layers. The second crosstalk cancelation structure 520 is coupled to second signal line 512 and a second via that connects to the other layers. The third signal line 514 is coupled to a third via that connects to the other layers and the fourth signal line 516 is coupled to a fourth via that connects to the other layers. In the second layer 504 (L2), there is a third crosstalk cancelation structure 522 (labeled DQ0). The third crosstalk cancelation structure 522 is coupled to the first data line 510 via the first via. In the third layer 506 (L3), there are a fourth crosstalk cancelation structure 524 (labeled DQ1) and a fifth crosstalk cancelation structure 526 (labeled DQ4). The fourth crosstalk cancelation structure 524 is coupled to the third signal line 514 via the third via. The fifth crosstalk cancelation structure 526 is coupled to the second signal line 512 via the second via. In the fourth layer 508 (L4), there are a sixth crosstalk cancelation structure 528 (labeled DQ0), a seventh crosstalk cancelation structure 530 (labeled DQ1), and an eighth crosstalk cancelation structure 532 (labeled DQ4). The sixth crosstalk cancelation structure 528 is coupled to the first signal line 510 via the first via. The seventh crosstalk cancelation structure 530 is coupled to the third signal line 514 via the third via. The eighth crosstalk cancelation structure 532 is coupled to the second signal line 512 via the second via. In the fourth layer 508 (L4), the fourth via is coupled to a contact area for the package terminal (e.g., BGA pad) (labeled DQ5).

The following table includes a number count of crosstalk cancelation structures between each pair of signal lines (labeled as DQ0, DQ1, DQ4, and DQ5).

|     | DQ1 | DQ0 | DQ5 | DQ4 |
| --- | --- | --- | --- | --- |
| DQ1 | —   | 1   | 1   | 0   |
| DQ0 | 1   | —   | 1   | 2   |
| DQ5 | 1   | 1   | —   | 1   |
| DQ4 | 0   | 2   | 1   | —   |

It should be noted that other multi-layer packages can include more or less data lines and more or less crosstalk cancelation structures than those illustrated in FIG. 5.

The crosstalk cancelation structures described herein have shown considerable amounts of crosstalk reduction in packages, such as illustrated and described below with respect to FIGS. 6A-6C.

Figures 6A, 6B, 6C:
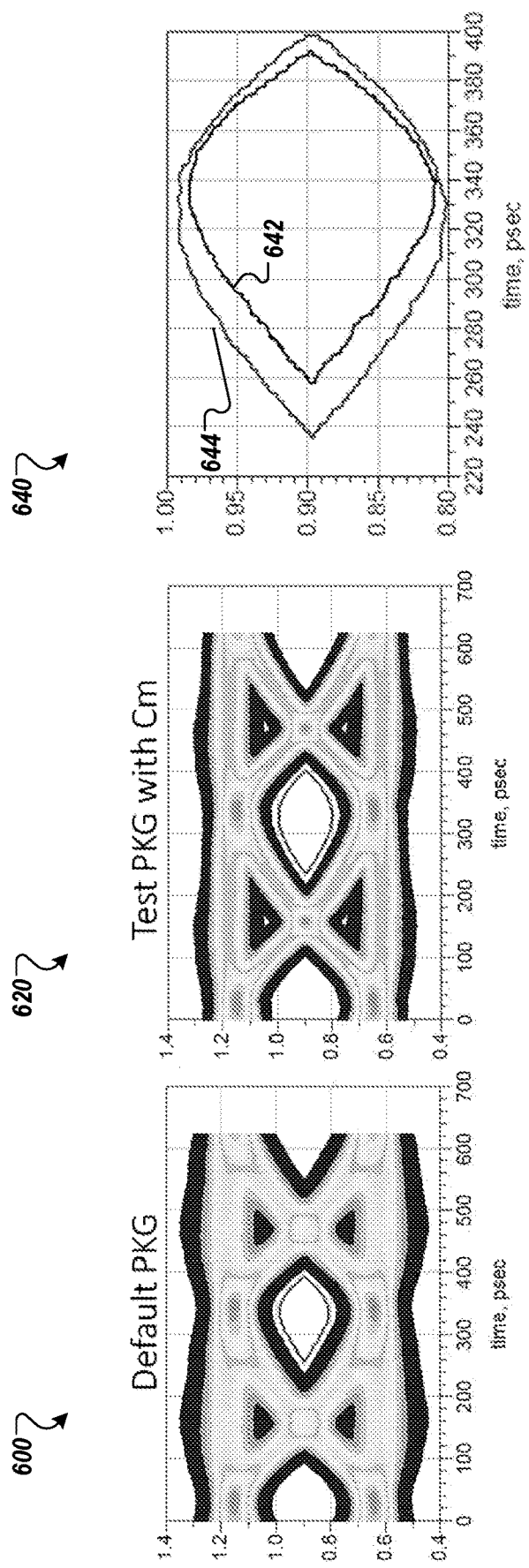
FIG. 6A is an eye diagram of a package without crosstalk cancelation structures according to one implementation.
FIG. 6B is an eye diagram of a multi-layer package with crosstalk cancelation structures according to one implementation.
FIG. 6C is an eye diagram illustrating an increase in eye height and eye width in the multi-layer package with the crosstalk cancelation structures of FIG. 6B as compared to the eye height and eye width in the package without crosstalk cancelation structures of FIG. 6A.

FIG. 6A is an eye diagram 600 of a package without crosstalk cancelation structures according to one implementation. FIG. 6B is an eye diagram 620 of a multi-layer package with crosstalk cancelation structures according to one implementation. The eye diagram 600 corresponds to a baseline package and the eye diagram 620 corresponds to a multi-layer package, such as the multi-layer package 500 illustrated and described above with respect to FIG. 5. As shown in FIGS. 6A and 6B, the eye diagram 600 of the baseline package is compared with the same package with the crosstalk cancellation structures being added above the BGA pads. As shown in FIGS. 6A and 6B, the multi-layer structure increases in both eye height and eye width. It should be noted that the inner contours of the two eyes in the eye diagrams 600 and 620 are transposed on top of each other to show the improvements in eye height and eye width. The inner contour 642 correspond to the baseline package and the inner contour 644 corresponds to the multi-layer package with crosstalk cancelation structures added above the BGAs, as illustrated in FIG. 6C. FIG. 6C is an eye diagram illustrating an increase in eye height and eye width in the multi-layer package with the crosstalk cancelation structures of FIG. 6B as compared to the eye height and eye width in the package without crosstalk cancelation structures of FIG. 6A.

In one embodiment, a semiconductor package includes a first signal line and a second signal line in a first conductive metal layer. The first signal line and the second signal line are adjacent signal lines. The semiconductor package also includes a first electrode structure disposed in a second conductive metal layer. A first insulating layer is disposed between the first conductive metal layer and the second conductive metal layer. A first via is coupled to the first signal line in the first conductive metal layer and the first electrode structure disposed in the second conductive metal layer. A second electrode structure is disposed in the first conductive metal layer and coupled to the second signal line. The second electrode structure and the first electrode structure are disposed opposite each other on the respective conductive metal layers.

In a further embodiment, the semiconductor package includes a first BGA pad and the first electrode structure and the second electrode structure are aligned with the first BGA pad. In some embodiments, a first width of the first electrode structure is substantially equal to a second width of the first BGA pad. In other embodiments, the first width is greater than or less than the second width of the first BGA pad.

In a further embodiment, the semiconductor package includes a third signal line in the first conductive metal layer and a third electrode structure in a third conductive metal layer. The third signal line and the second signal line are adjacent signal lines in the first conductive metal layer. A second insulating layer is disposed between the second conductive metal layer and the third conductive metal layer and a second via is coupled to the third signal line in the first conductive metal layer and the third electrode structure in the third conductive metal layer. The third electrode structure and the second electrode structure are disposed opposite each other on the respective conductive metal layers.

In a further embodiment, the semiconductor package includes a fourth electrode structure in a fourth conductive metal layer. A third insulating layer is disposed between the third conductive metal layer and the fourth conductive metal layer. The first via is coupled to the fourth electrode structure in the fourth conductive metal layer. In some embodiments, semiconductor package includes a first BGA pad and the first electrode structure, the second electrode structure, the third electrode structure, and the fourth electrode structure are aligned with the first BGA pad. The he first BGA pad can be coupled to the fourth electrode structure, such as in the same layer or in a separate layer through a via between the layers.

In another embodiment, the semiconductor package includes a first BGA pad and a second BGA pad. The first electrode structure and the second electrode structure are aligned with the first BGA pad. A third electrode structure is disposed in the second conductive metal layer. The third electrode structure is aligned with the second BGA pad. A second TSV is coupled to the second signal line and the second electrode structure in the first conductive metal layer and the third electrode structure in the second conductive metal layer. In a further embodiment, the semiconductor package includes a fourth electrode structure disposed in the first conductive metal layer, the fourth electrode structure being aligned with the second BGA pad.

In another embodiment, a semiconductor package includes a first package terminal and a second package terminal, a first electrode structure disposed in a first conductive metal layer, and a second electrode structure disposed in a second conductive metal layer. The second conductive metal layer is separated from the first conductive metal layer by a first insulating layer. The first electrode structure and the second electrode structure are formed opposite each other on the first conductive metal layer and the second conductive metal layer, respectively. The semiconductor package also includes a first signal line disposed in the second conductive metal layer, a second signal line disposed in the second conductive metal layer, a first via coupled to the first electrode structure in the first conductive metal layer and the first signal line in the second conductive metal layer, and a second via coupled to the second electrode structure in the second conductive metal layer and the second signal line in the second layer.

In a further embodiment, the semiconductor package includes a third package terminal and a third electrode structure disposed in a third conductive metal layer. The third conductive metal layer is separated from the first conductive metal layer by the first insulating layer and is separated from the second conductive metal layer by a second insulating layer. The first electrode structure and the third electrode structure are formed opposite each other on the first conductive metal layer and the third conductive metal layer, respectively and the second electrode structure and the third electrode structure are formed opposite each other on the second conductive metal layer and the third conductive metal layer, respectively. The semiconductor package includes a third signal line disposed in the second conductive metal layer and a third via coupled to the third electrode structure in the third conductive metal layer and the third signal line in the second conductive metal layer.

In a further embodiment, the semiconductor package includes a fourth package terminal and a fourth electrode structure disposed in a fourth conductive metal layer. The fourth conductive metal layer is separated from the second conductive metal layer by the second insulating layer and is separated from the third conductive metal layer by a third insulating layer. The first electrode structure, the second electrode structure, the third electrode structure, and the fourth electrode structure are aligned on the first conductive metal layer, the second conductive metal layer, the third conductive metal layer, and the fourth conductive metal layer, respectively.

In one embodiment, the semiconductor package includes an integrated circuit device having a first conductive pad and a second conductive pad. The first conductive pad is coupled to the first signal line and the second conductive pad is coupled to the second signal line. The first package terminal and the second package terminal can be BGA pads, as well as other package terminals, such as C4 solder bumps, copper-pillar bumps, or the like. In another embodiment, the integrated circuit device includes more than two conductive pads that are coupled to multiple signal lines of the semiconductor package. The semiconductor package can include additional combinations of electrode structures above the package terminals that couple to the multiple signal lines.

The methods, systems, and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of integrated circuits, integrated circuit dies, interconnects, etc., described above with respect to FIGS. 1A-4C. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular implementations may vary from these exemplary details and still be contemplated to be within the scope of the present disclosure.

The description above includes specific terminology and drawing symbols to provide a thorough understanding of the present disclosure. In some instances, the terminology and symbols may imply specific details that are not required to practice the disclosure. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments.

Component circuitry within integrated circuit devices may be implemented using metal oxide semiconductor (MOS) technology, bipolar technology, or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g. '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the disclosure has been described with reference to specific embodiments thereof, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A semiconductor package comprising:
    an integrated circuit device comprising a plurality of conductive pads;
    a plurality of package terminals;
    a plurality of conductive metal layers separated by insulating layers, wherein the plurality of conductive metal layers comprising signal lines formed in the plurality of conductive metal layers to route signals between the plurality of package terminals and the plurality of conductive pads of the integrated circuit device, wherein:
        a first signal line coupled to a first package terminal of the plurality of package terminals;
        a second signal line coupled to a second package terminal of the plurality of package terminals, the first signal line and second signal line being adjacent signal lines and conductively isolated;
        the first signal line comprises a first electrode structure disposed in a first layer of the plurality of conductive metal layers;
        the second signal line comprises a second electrode structure disposed in a second layer of the plurality of conductive metal layers;
        the first electrode structure and the second electrode structure are formed opposite each other on the first layer and the second layer, respectively, such that the first electrode structure and the second electrode structure are aligned on a common axis perpendicular to the first layer and the second layer;
        a third signal line coupled to a third package terminal of the plurality of package terminals, the third signal line being adjacent to at least one of the first signal line or the second signal line, and the third signal line comprises a third electrode structure disposed in a third layer of the plurality of conductive metal layers; and
        the first signal line further comprises a fourth electrode structure disposed in a fourth layer of the plurality of conductive metal layers.

2. The semiconductor package of claim 1, further comprising a first via coupled to the fourth electrode structure in the fourth layer and the first electrode structure in the first layer.

3. The semiconductor package of claim 1, further comprising:
    the first via coupled to the first package terminal and the first electrode structure; and
    a second via coupled to the second package terminal and the second electrode structure.

4. The semiconductor package of claim 3, further comprising:
    a third via coupled to the third package terminal;
    wherein the second electrode structure and the third electrode structure are formed opposite each other on the second layer and the third layer, respectively.

5. The semiconductor package of claim 4, further comprising:
    a fourth package terminal of the plurality of package terminals;
    a fourth via coupled to the fourth package terminal; and
    a fourth signal line coupled to the fourth package terminal, the fourth signal line comprising a fourth electrode structure disposed in a fourth layer of the plurality of conductive metal layers, wherein the third electrode structure and the fourth electrode structure are formed opposite each other on the third layer and the fourth layer, respectively.

6. A semiconductor package comprising:
a first signal line in a first conductive metal layer;
a second signal line in the first conductive metal layer, wherein the first signal line and the second signal line are adjacent signal lines;
a first electrode structure disposed in a second conductive metal layer;
a first insulating layer disposed between the first conductive metal layer and the second conductive metal layer;
a first via coupled to the first signal line in the first conductive metal layer and the first electrode structure disposed in the second conductive metal layer;
a second electrode structure disposed in the first conductive metal layer and coupled to the second signal line, wherein the second electrode structure and the first electrode structure are disposed opposite each other such that the first electrode structure and the second electrode structure are aligned on a common axis perpendicular to the first conductive metal layer and the second conductive metal layer;
a third signal line in the first conductive metal layer;
a third electrode structure in a third conductive metal layer, wherein the third signal line and the second signal line are adjacent signal lines in the first conductive metal layer;
a second insulating layer disposed between the second conductive metal layer and the third conductive metal layer;
a second via coupled to the third signal line in the first conductive metal layer and the third electrode structure in the third conductive metal layer, wherein the third electrode structure and the second electrode structure are disposed opposite each other:
a fourth electrode structure in a fourth conductive metal layer;
a third insulating layer disposed between the third conductive metal layer and the fourth conductive metal layer, wherein the first via is coupled to the fourth electrode structure in the fourth conductive metal layer; and
a first ball grid array (BGA) pad, wherein the first electrode structure, the second electrode structure, the third electrode structure, and the fourth electrode structure are aligned with the first BGA pad, wherein the first BGA pad is coupled to the fourth electrode structure.

7. The semiconductor package of claim 6, wherein a first width of the first electrode structure is equal to a second width of the first BGA pad.

8. A semiconductor package comprising:
a first package terminal and a second package terminal;
a first electrode structure disposed in a first conductive metal layer;
a second electrode structure disposed in a second conductive metal layer, wherein the second conductive metal layer is separated from the first conductive metal layer by a first insulating layer, wherein the first electrode structure and the second electrode structure are formed opposite each other on the first conductive metal layer and the second conductive metal layer, respectively, such that the first electrode structure and the second electrode structure are aligned on a common axis perpendicular to the first conductive metal layer and the second conductive metal layer;
a first signal line disposed in the second conductive metal layer, the first signal line being coupled to the first package terminal;
a second signal line disposed in the second conductive metal layer, the second signal line being coupled to the second package terminal;
a first via coupled to the first electrode structure in the first conductive metal layer and the first signal line in the second conductive metal layer; and
a second via coupled to the second electrode structure in the second conductive metal layer and the second signal line in the second conductive metal layer.

9. The semiconductor package of claim 8, further comprising:
a third package terminal;
a third electrode structure disposed in a third conductive metal layer, wherein the third conductive metal layer is separated from the first conductive metal layer by the first insulating layer and is separated from the second conductive metal layer by a second insulating layer, wherein the first electrode structure and the third electrode structure are formed opposite each other on the first conductive metal layer and the third conductive metal layer, respectively and the second electrode structure and the third electrode structure are formed opposite each other on the second conductive metal layer and the third conductive metal layer, respectively;
a third signal line disposed in the second conductive metal layer, the third signal line being coupled to the third package terminal; and
a third via coupled to the third electrode structure in the third conductive metal layer and the third signal line in the second conductive metal layer.

10. The semiconductor package of claim 9, further comprising:
a fourth package terminal;
a fourth electrode structure disposed in a fourth conductive metal layer, wherein the fourth conductive metal layer is separated from the second conductive metal layer by the second insulating layer and is separated from the third conductive metal layer by a third insulating layer, wherein the first electrode structure, the second electrode structure, the third electrode structure, and the fourth electrode structure are aligned on the common axis; and
a fourth signal line disposed in the second conductive metal layer, the fourth signal line being coupled to the fourth package terminal.

11. The semiconductor package of claim 8, further comprising
an integrated circuit device comprising a first conductive pad and a second conductive pad, the first conductive pad being coupled to the first signal line and the second conductive pad being coupled to the second signal line.

12. The semiconductor package of claim 8, wherein the first package terminal is at least one of a first ball grid array (BGA) pad, a first controlled collapse chip connection (C4) solder bump, or a first copper-pillar bump, and the second package terminal is at least one of a second BGA pad, a second C4 solder bump, or a second copper-pillar bump.

* * * * *